United States Patent [19]
Doman

[11] Patent Number: 4,694,227
[45] Date of Patent: Sep. 15, 1987

[54] CURRENT SHARING CIRCUIT

[75] Inventor: Herbert M. Doman, Camarillo, Calif.

[73] Assignee: Everest & Jennings, Inc., Camarillo, Calif.

[21] Appl. No.: 851,230

[22] Filed: Apr. 14, 1986

[51] Int. Cl.$^4$ ............................................. H03K 17/56
[52] U.S. Cl. ..................................... 318/80; 307/242; 307/254; 307/296 R; 323/272
[58] Field of Search .............. 318/80, 345 B; 307/239, 307/240, 241, 242, 253, 285, 270, 254, 296 A, 252 K, 571; 323/265, 268, 269, 271, 272

[56] References Cited

U.S. PATENT DOCUMENTS

| | | | |
|---|---|---|---|
| 3,421,025 | 1/1969 | Mitchell et al. | 307/285 X |
| 3,633,051 | 1/1972 | Press | 307/242 X |
| 4,489,256 | 12/1984 | Brodsky | 318/60 X |
| 4,616,142 | 10/1986 | Upadhyay et al. | 307/242 |

FOREIGN PATENT DOCUMENTS

| | | | |
|---|---|---|---|
| 53-114051 | 10/1978 | Japan | 323/269 |
| 0706930 | 12/1979 | U.S.S.R. | 307/253 |
| 0866740 | 9/1981 | U.S.S.R. | 307/254 |

Primary Examiner—William M. Shoop, Jr.
Assistant Examiner—Bentsu Ro
Attorney, Agent, or Firm—Kelly, Bauersfeld & Lowry

[57] ABSTRACT

A controller for a wheelchair motor or the like including two power transistors each having a base and a collector-emitter path, the collector-emitter paths being connected in parallel. At least one oscillator and a flip-flop are provided to supply pulses alternately to the transistor bases so that the transistors are never turned on simultaneously. In another system, two or more transistors are connected in parallel and are gated on in digital succession responsive to the outputs of a ring counter.

11 Claims, 10 Drawing Figures

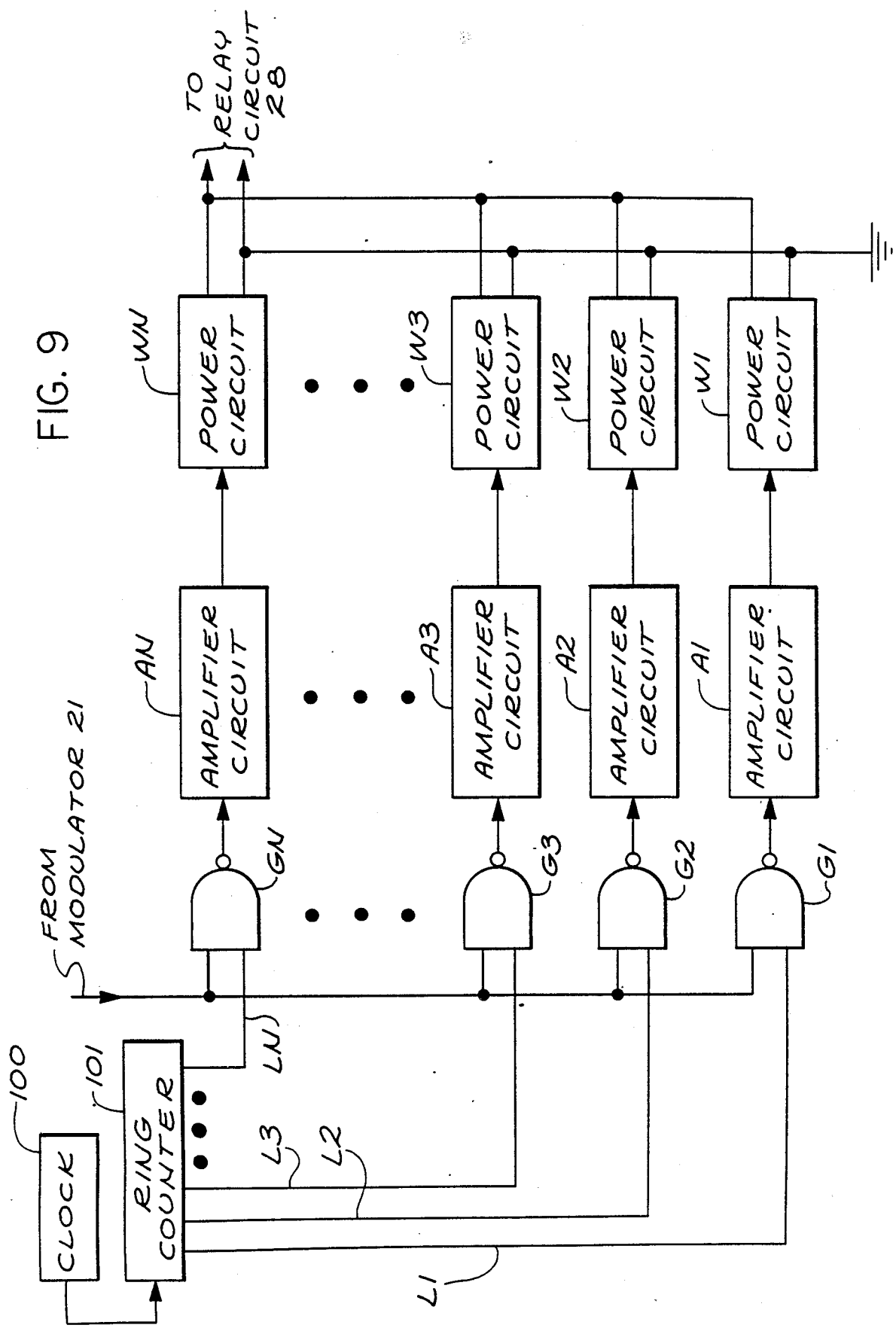

CURRENT SHARING CIRCUIT

BACKGROUND OF THE INVENTION

This invention relates to a circuit for preventing overheating in transistors, and more particularly to means for limiting power dissipation in power transistors.

PRIOR ART STATEMENT

It is known in the art to supply current to the motors of an electricity driven wheelchair by the use of two or more power transistors with all of their collector-emitter circuits connected in parallel. It is also conventional, although inefficient, to connect a resistor in the collector circuit of each transistor to equalize the collector currents flowing simultaneously in the transistors.

It is not possible to manufacture power transistors in such a way that the temperature characteristics thereof are all identical. This is due, in part, to the fact that when connected in parallel with each other and in series with a load, it is not possible to maintain a rated voltage drop across the transistors and to maintain a rated current through each. Although one or more transistors may draw a rated current, one or more or all may not. The latter may then burn out and disable the circuit.

SUMMARY OF THE INVENTION

In accordance with the circuit of the present invention, the above-described and other disadvantages of the prior art are overcome by providing at least two parallel connected power transistors to supply current to a load, wherein only one of the transistors is gated on at a time.

According to another feature of the invention, at least one pulse for each transistor has a width which is variable with a manual control such as, for example, a conventional joystick for a power wheelchair.

Another feature of the invention resides in the use of a conventional manually controlled pulse width modulator operable from a conventional joystick control of a power wheelchair, and means including an oscillator of a lower frequency to cause a plurality of power transistors to be gated on by successive groups of constant amplitude modulator output pulses, the number of pulses in each group being equal to the frequency of the modulator output times one-half or less of the period of the oscillator.

Another feature of the invention resides in an efficient circuit without collector resistors to equalize transistor currents.

BRIEF DESCRIPTION OF THE DRAWINGS

In the drawings, which are to be regarded as merely illustrative:

FIG. 9 is a block diagram of an alternative embodiment of the present invention.

DESCRIPTION OF THE PREFERRED EMBODIMENTS

Figure 1:
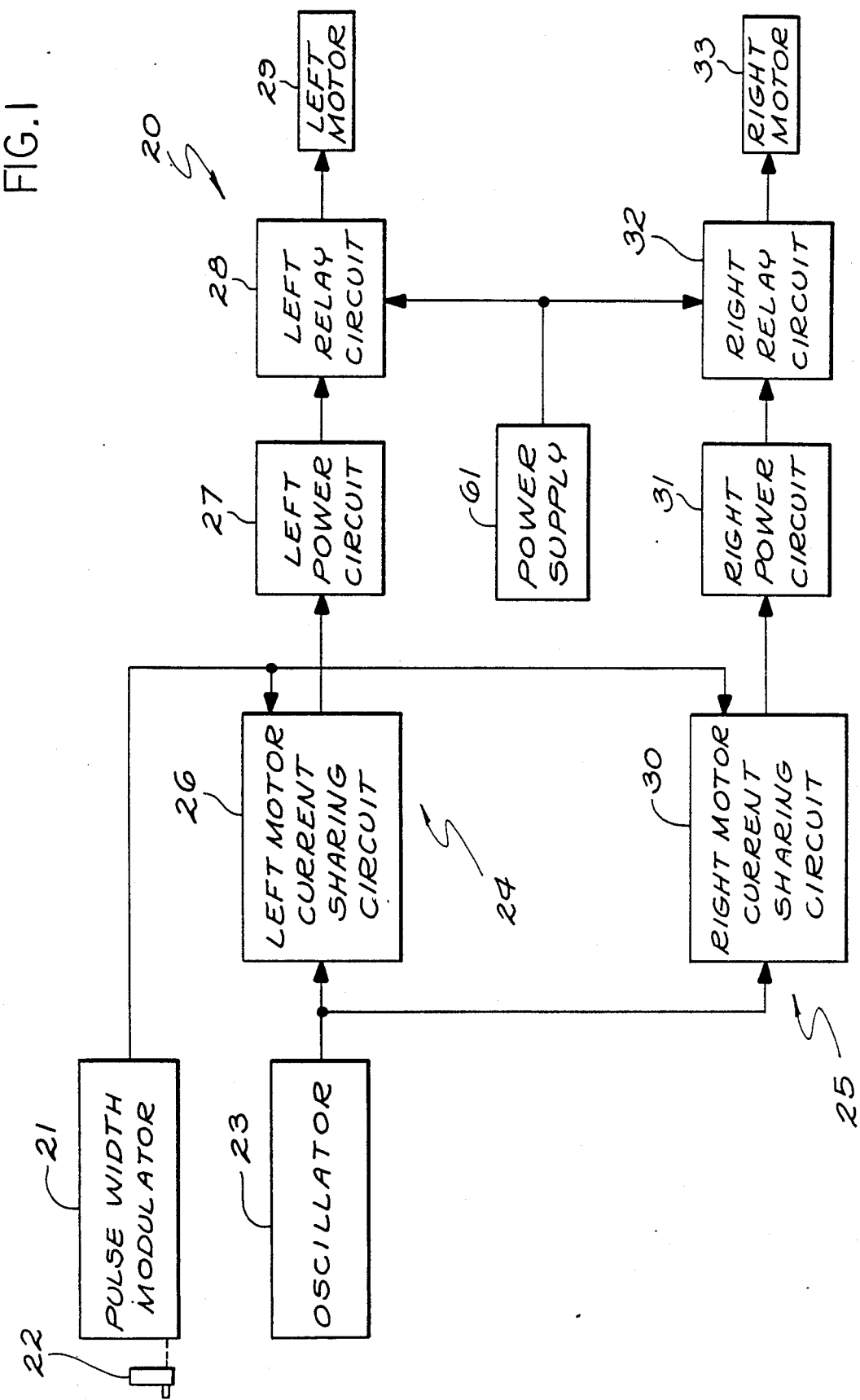
FIG. 1 is a block diagram of the system of the present invention.

In the drawings, in FIG. 1, a controller 20 is shown for a power wheelchair.

Figure 4:
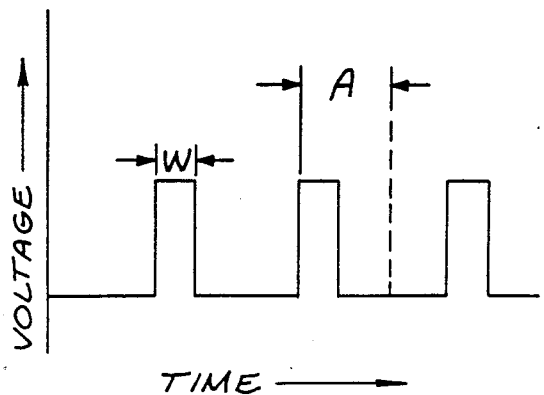

A pulse width modulator 21 is provided to produce output pulses shown in FIG. 4 of a width W manually variable with a device 22. Device 22 may be a control from a conventional power wheelchair such as a joystick, if desired. In FIG. 4, note will be taken that the period of the waveform is 2A. The pulse width W may vary from zero to A.

In FIG. 1, an oscillator 23 provides an input to two channels 24 and 25. Channel 24 includes a left motor current sharing circuit 26, a left power circuit 27, a left relay circuit 28, and a left motor 29. Channel 25 includes a right motor current sharing circuit 30, a right power circuit 31, a right relay circuit 32 and a right motor 33. Circuits 26, 27 and 28 may respectively be identical to or substantially identical to circuits 30, 31 and 32, if desired. The same is true of the two motors 29 and 33. Furthermore, motors 29 and 33 may be conventional. So also may be device 22, modulator 21 and oscillator 23. For the foregoing reasons, only circuits 26, 27 and 28 will be described in detail.

Figure 2:
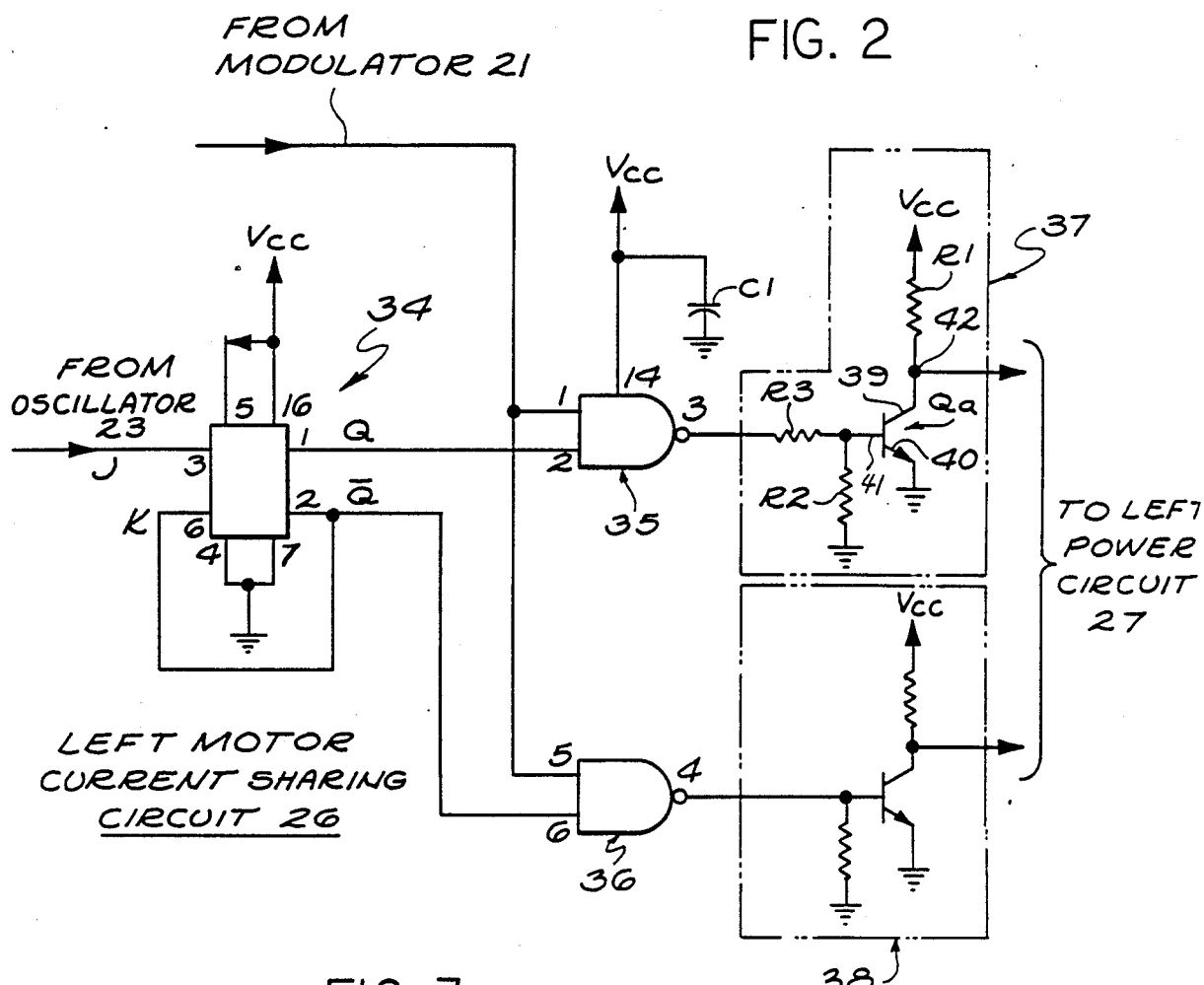
FIG. 2 is a schematic diagram of a left motor current sharing circuit shown in FIG. 1.

Circuit 26 is shown in FIG. 2 including a JK flip flop 34 having a J input to pin 3 from oscillator 23. Q and $\bar{Q}$ outputs of flip flop 34 are produced on pins 1 and 2 respectively.

In FIG. 2, NAND gates 35 and 36 have inputs on pins 1 and 5, respectively, from modulator 21. The NAND gate 35 also has an input on pin 2 from pin 1 of flip flop 34. The NAND gate 36 has an input on pin 6 from pin 2 of flip flop 34.

A supply voltage Vcc is connected to NAND gate 35, a capacitor C1 being connected from Vcc to ground.

Two amplifier circuits 37 and 38 are shown in FIG. 2. Both circuits 37 and 38 may be identical or substantially identical to each other. Only circuit 37 will therefore be described in detail. Circuits 37 and 38 are respectively connected from output pins 3 and 4 of NAND gates 35 and 36, respectively, to left power circuit 27.

Amplifier circuit 37 in FIG. 2 includes a transistor Qa having a collector 39, an emitter 40 and a base 41. The output is taken from collector 39 at junction 42. A resistor R1 is connected from junction 42 to Vcc. A resistor R2 is connected from base 41 to ground. A resistor R3 is connected from pin 3 of NAND gate 35 to base 41. Emitter 40 is grounded.

Figure 3:
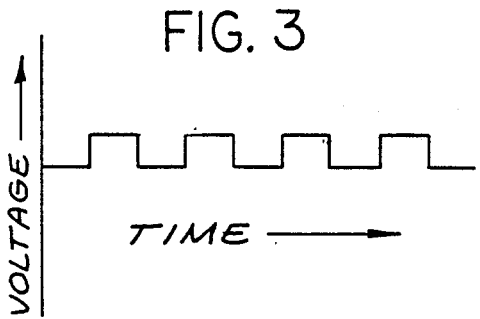
FIGS. 3, 4, and 5 are graphs of waveforms characteristic of the operation of the current sharing circuit shown in FIG. 2.

The waveform on pin 3 of flip flop 34 may be that shown in FIG. 3, if desired. Preferably, the pulse repetition frequency (PRF) of the output pulses of modulator 21 appearing on pins 1 and 5 of NAND gates 35 and 36 is of an order of magnitude higher than the PRF of Q and its complement on pin 2 of flip flop 34.

Figure 5:
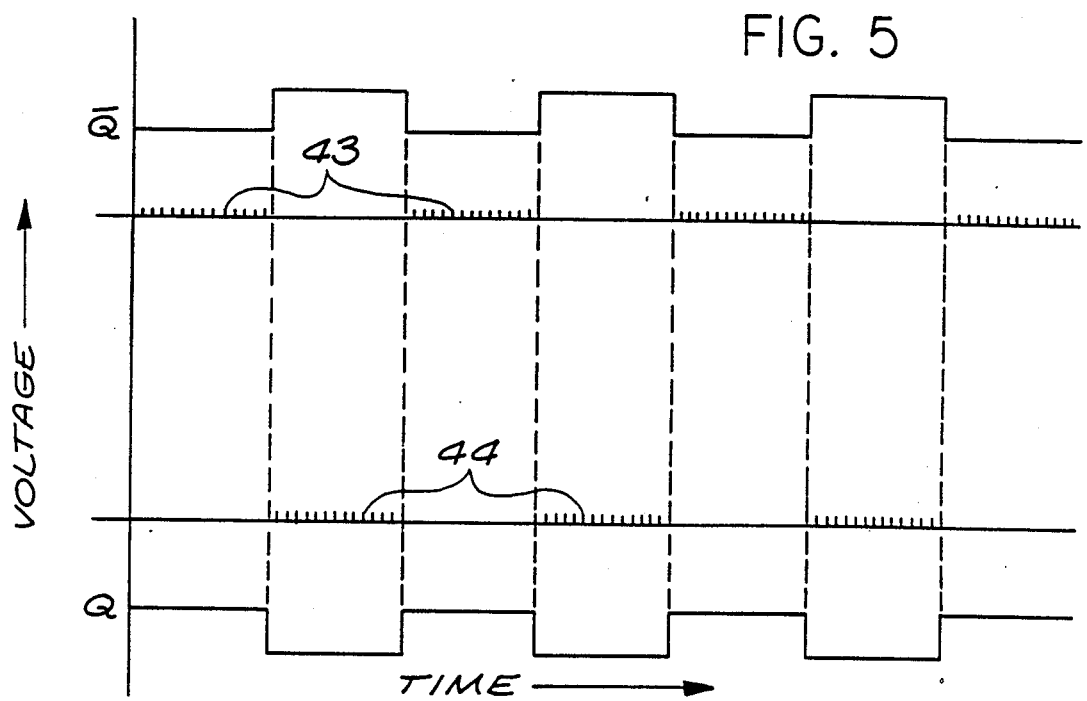

The signals Q and $\bar{Q}$ are shown in FIG. 5. Groups of pulses appearing at output pin 3 of NAND gate 35 are shown at 43. Groups of pulses appearing at output pin 4 of NAND gate 36 are shown at 44. Pulse groups 43 and 44, if enlarged, would appear as the waveform of FIG. 4 inverted. Note that the pulses at output junction 42 would appear as in FIG. 4 without the inversion. This is true because amplifier circuit 37 inverts its input.

Figure 6:
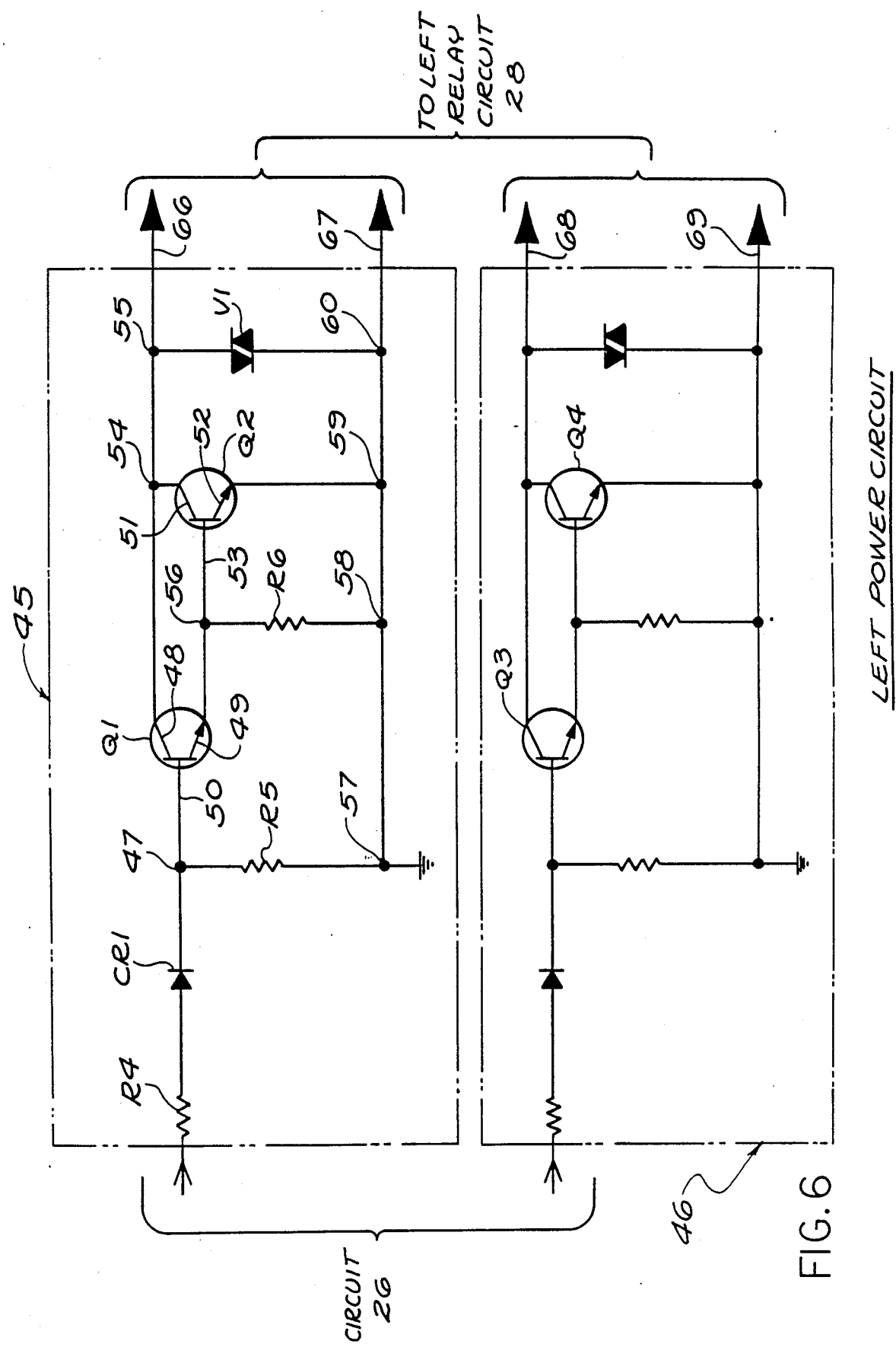
FIG. 6 is a schematic diagram of a left power circuit shown in FIG. 1.

Left power circuit 27 is shown in FIG. 6 including power circuits 45 and 46 respectively connected from amplifier circuits 37 and 38. Power circuit 45 may be identical to or substantially identical to power circuit 46, if desired. Thus, only power circuit 45 will be described in detail.

In FIG. 6, power circuit 45 includes a resistor R4 and a diode CR1 connected in series from junction 42 (FIG. 2) to a junction 47 with diode CR1 being poled to be condutive toward junction 47.

Power circuit 45 also includes a transistor Q1 having a collector 48, an emitter 49 and a base 50. Power circuit 45 also includes a power transistor Q2 having a collector 51, an emitter 52, and a base 53.

Other junctions 54, 55, 56, 57, 58, 59 and 60 are also provided in FIG. 6. Junction 57 is grounded. A resistor R5 is connected between junctions 47 and 57. Transistor base 50 is connected from junction 47. Collectors 48 and 51 are connected to junction 54. An output junction 55 is connected from junction 54. Emitter 49 and base 53 are connected to junction 56. A resistor R6 is connected between junctions 56 and 58. Junctions 58-60 are connected from junction 57, junction 60 being an output junction. Emitter 52 is connected to junction 59. A conventional multilayer semiconductor device V1 is connected between junctions 55 and 60 to maintain a constant voltage therebetween.

Figure 7:
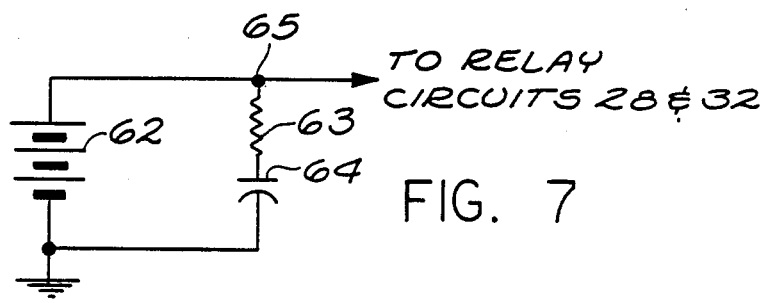
FIG. 7 is a schematic diagram of a power supply shown in FIG. 1.

In FIG. 1, a power supply 61 is provided for relay circuits 28 and 32. Power supply 61 is shown in greater detail in FIG. 7 including a battery 62, and a series circuit including a resistor 63 and a capacitor 64 connected thereacross. The negative pole of the battery 62 is grounded and the positive pole is connected to an output junction 65.

In FIG. 6, output leads are provided at 66, 67, 68 and 69. Note in FIG. 8 that the two outputs of FIG. 6 are connected in parallel. Note that leads 66 and 68 are connected to a common junction 70 and that leads 67 and 69 are connected to a grounded junction 71.

Figure 8:
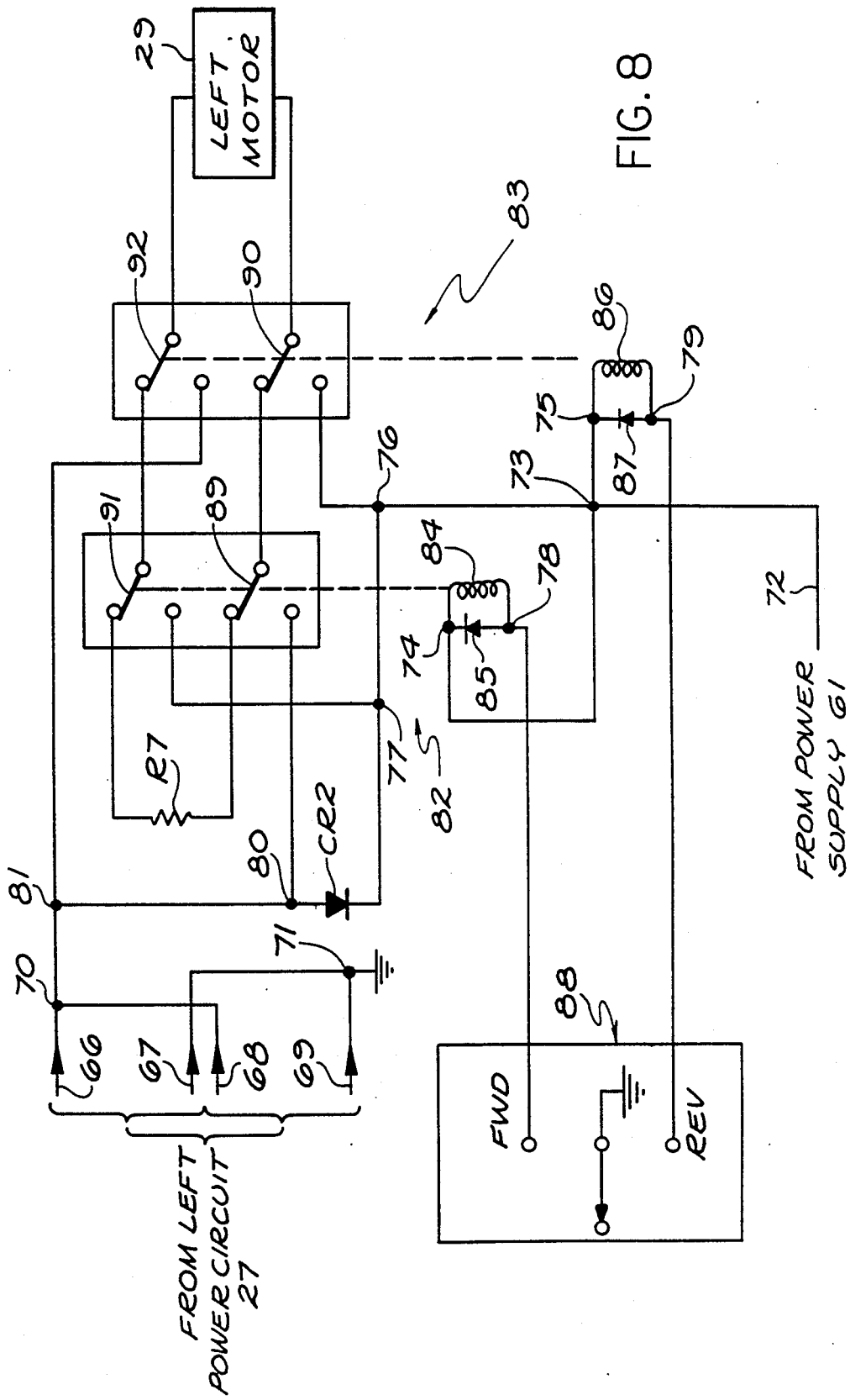
FIG. 8 is a schematic diagram of a left relay circuit shown in FIG. 1.

In FIG. 8, power is supplied over input lead 72 to junctions 73, 74, 75, 76 and 77. Other junctions 78, 79, 80 and 81 are also provided. Junctions 70 and 81 are connected together.

Relays are provided at 82 and 83. Relay 82 includes a winding 84 and a diode 85 connected between junctions 74 and 78. Relay 83 includes a winding 86 and a diode 87 connected between junctions 75 and 79. A switch 88 is provided to cause one of the relays 82 and 83 to be energized at a time. Switch 88 is thus selectively actuable to ground one of the junctions 78 and 79. The relay circuits 28 and 32 both may be entirely conventional, if desired.

In FIG. 8 the positive supply voltage on lead 72 is connected to motor 29 via poles 91 and 92 when relay 82 is energized, and via pole 90 when relay 83 is energized.

Junctions 70 and 81 are connected together. Thus, motor 29 is connected to ground during the output pulses of amplifier circuits 37 and 38 via junction 70 and transistors Q2 and Q4 via poles 89 and 90 when relay 82 is energized, and via pole 92 when relay 83 is energized.

Resistor R7 in FIG. 8 is a dynamic braking resistor. See Brodsky, U.S. Pat. 4,489,256 issued Dec. 18, 1984.

OPERATION OF THE EMBODIMENT OF FIG. 1

In FIG. 1, operation of left motor 29 is as follows. The width of the output pulses (FIG. 4) of pulse width modulator 21 is adjusted to somewhere within the range of zero to A. Flip flop 34 in FIG. 2 then causes groups of the inverted pulses of FIG. 4 to be produced alternately at the output pin 3 of NAND gate 35 and then at the output pin 4 of NAND gate 36. Amplifier circuits 37 and 38 then reinvert pulse groups 43 and 44 (FIG. 5). The reinverted pulses therefore look like those of FIG. 4. These are impressed upon power circuits 45 and 46 in FIG. 6. Transistors Q1 and Q2 are then switched on intermittently during the generation of pulses in one of the groups 43 (FIG. 5) inverted at the output of amplifier circuit 37.

When power transistors Q1 and Q2 are switched on, transistor Q2 effectively grounds one side of left motor 29 intermittently. For example, if relay 82 is energized (FIG. 8), left motor 29 is grounded via poles 90 and 89 of relays 83 and 82, respectively, junctions 80, 81, 70, junctions 55 and 54 (FIG. 6) transistor Q2, junctions 59, 58 and 57, the last being grounded.

When relay 82 is energized, note will be taken that the other side of left motor 29 receives a positive potential via lead 72, through junctions 73, 76, 77 and through poles 91 and 92 of relays 82 and 83.

When relay 83 is energized, the other side of left motor 29 is intermittently grounded through pole 92, junctions 81, 70, 55 (FIG. 6), 54, transistor Q2, junctions 59, 58 and 57, as before.

When relay 83 is energized, a positive potential is supplied to left motor 29 via lead 72, junctions 73 and 76 and pole 90 of relay 83.

Circuits 30, 31 and 32 in FIG. 1 operate in the same way as circuits 26, 27 and 28.

NAND gate 36, amplifier circuit 38 and power circuit 46 operate in the same manner as NAND gate 35, amplifier circuit 37 and power circuit 45, respectively, except that the pulses that gate on transistors Q1 and Q2 occur during the period that Q is low and the pulses that gate on transistors Q3 and Q4 occur during the period that Q is high.

An alternative embodiment of the present invention is shown in FIG. 9 for use with pulse width modulator 21 and in lieu of oscillator 23 and circuits 26 and 27. The embodiment of FIG. 9 may be time-shared with the right motor 33 or employed in partial or total duplicate in lieu of circuits 30 and 31.

In FIG. 9, a conventional clock 100 operates a conventional ring counter 101 which resets on receipt of a predetermined number of pulses from clock 100.

Figure 10:
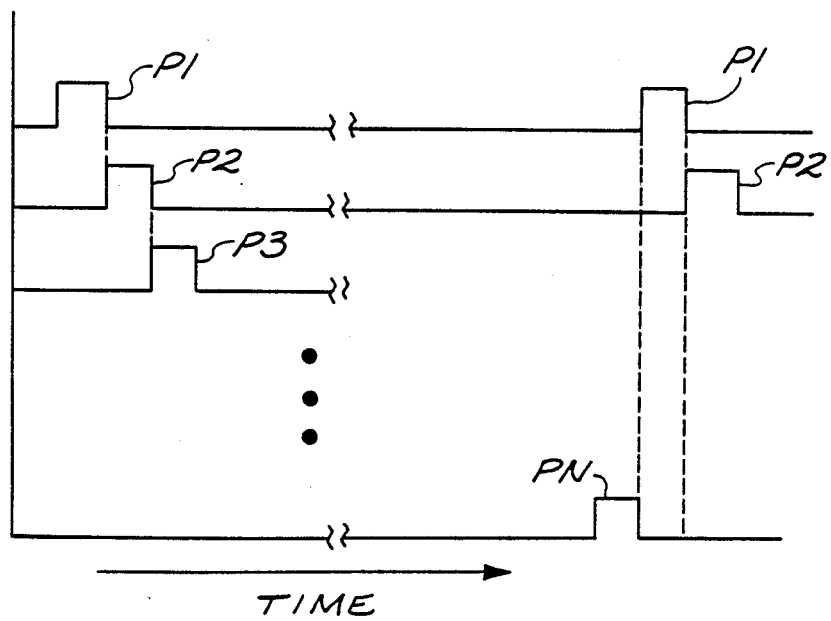
FIG. 10 is a graph of a group of waveforms characteristic of the operation of a ring counter.

Ring counter 101 has output leads L1, L2, L3 . . . LN on which pulses P1, P2, P3 . . . PN are respectively produced. See FIG. 10.

NAND gates G1, G2, G3 . . . GN are connected respectively from leads L1, L2, L3 . . . LN to power circuits W1, W2, W3 WN via amplifier circuits A1, A2, A3 . . . AN. Each of the NAND gates G1-GN may be identical to conventional NAND gate 35, if desired. Each of the amplifier circuits A1-AN may be identical to amplifier circuit 37, if desired. Each of the power circuits W1-WN may be identical to power circuit 45, if desired.

Note that the outputs of all the power circuits are connected in parallel to relay circuit 28.

OPERATION OF THE EMBODIMENT OF FIG. 9

In the operation of the embodiment of FIG. 9, groups of pulse width modulated (PWM) pulses gate on power circuits W1, W2, W3 ... WN in digital succession. Only one power circuit W is gated on at a time and for a period equal to the sum of the widths of one entire group of pulses. One group of PWM pulses occurs during each pulse P essentially with the same number of PWM pulses in each group.

Again, the burst frequency output of each amplifier circuit A is preferably an order of magnitude lower than the frequency of the PWM pulses.

What is claimed is:

1. A controller circuit, comprising:
   a source of potential;
   a load;
   a first power transistor having a collector-emitter circuit and including a collector, an emitter and a base;
   a second power transistor having a collector, an emitter, and a base,
   said source, said load and said collector-emitter circuit all being connected in series,
   said second transistor collector and emitter being connected to said first transistor collector and emitter respectively; and
   synchronous means connected to said transistor bases for gating said first transistor on while maintaining said second transistor at cut-off and vice versa.

2. The invention as defined in claim 1, wherein:
   a voltage regulating device is connected between said first transistor collector and emitter.

3. The invention as defined in claim 1, wherein:
   said source, said load and said collector-emitter circuit are all directly connected,
   said second transistor collector and emitter being directly connected to said first transistor collector and emitter, respectively.

4. The invention as defined in claim 3, wherein a voltage regulating device is connected between said first transistor collector and emitter.

5. The invention as defined in claim 4, wherein said load is an inductive load.

6. A controller circuit, comprising:
   a source of potential;
   a load;
   first, second . . . Nth power circuits having their outputs connected in parallel,
   said power circuit outputs being connected in series with said source and said load; and
   synchronous means to apply a gating pulse to each of said power circuits in digital succession,
   all of said gating pulses occurring over mutually exclusive periods of time.

7. A controller circuit, comprising:
   an oscillator;
   a flip flop connected from said oscillator to produce first and second complementary bilevel signals at a first pulse repetition frequency (PRF);
   first means for providing first pulses at a second PRF which is an order of magnitude higher than said first PRF;
   first and second NAND gates connected from said flip flop to receive said first and second signals, respectively,
   said NAND gates also each being supplied with a second input of said first pulses;
   a source of potential;
   a load;
   a first power transistor having a collector-emitter circuit and including a collector, an emitter and a base:
   a second power transistor having a collector, an emitter and a base;
   said source, said load and said collector-emitter circuit all being connected in series,
   said second transistor collector and emitter being connected to said first transistor collector and emitter, respectively;
   second means for gating said first transistor on when the output of said first NAND gate is low; and
   third means for gating said second transistor on when the output of said second NAND gate is low.

8. The invention as defined in claim 7, wherein said first means includes a manually adjustable pulse width modulator.

9. The invention as defined in claim 8, wherein said load is a wheelchair motor.

10. The invention as defined in claim 9, wherein said source, said load and said collector-emitter circuit are all directly connected;
    said second transistor, collector and emitter being directly connected to said first transistor, collector and emitter, respectively.

11. The invention as defined in claim 10 wherein:
    a voltage regulating device is connected between the collector and emitter of said first transistor.

* * * * *